(12) United States Patent
Nakasu et al.

(10) Patent No.: US 8,206,775 B2
(45) Date of Patent: Jun. 26, 2012

(54) METHOD FOR REPAIRING PATTERN DEFECT ON ELECTRONIC CIRCUIT AND APPARATUS THEREFOR

(75) Inventors: Nobuaki Nakasu, Kawasaki (JP); Tadao Edamura, Yokohama (JP); Hirofumi Sunaoshi, Chousei (JP); Takemi Igeta, Mobara (JP); Kazuhiro Fukuchi, Mobara (JP)

(73) Assignees: Hitachi Displays, Ltd., Chiba (JP); Panasonic Liquid Crystal Display Co., Ltd., Hyogo-ken (JP)

(*) Notice: Subject to any disclaimer, the term of this patent is extended or adjusted under 35 U.S.C. 154(b) by 569 days.

(21) Appl. No.: 12/359,405

(22) Filed: Jan. 26, 2009

(65) Prior Publication Data

US 2009/0196978 A1  Aug. 6, 2009

(30) Foreign Application Priority Data

Jan. 31, 2008  (JP) .................................. 2008-020248

(51) Int. Cl.
    C23C 16/52   (2006.01)
    B05D 5/12    (2006.01)
    B05D 3/00    (2006.01)
    B28B 19/00   (2006.01)
    G01R 31/00   (2006.01)
    G01R 31/08   (2006.01)
    H01H 31/02   (2006.01)
    B05C 11/00   (2006.01)

(52) U.S. Cl. .......... 427/8; 427/96.1; 427/98.4; 427/140; 324/500; 324/512

(58) Field of Classification Search ................. 29/402.1, 29/825, 829; 118/46, 712; 324/500, 512, 324/522, 555; 427/8, 96, 96.1, 98.4, 140
See application file for complete search history.

(56) References Cited

U.S. PATENT DOCUMENTS 7,274,194 B1 * 9/2007 Anderson et al. ............. 324/522
2007/0091139 A1 * 4/2007 Takatsuka ...................... 347/29

FOREIGN PATENT DOCUMENTS

JP  57-118246   7/1982
JP  2004-045069 2/2004

* cited by examiner

Primary Examiner — Michael Cleveland
Assistant Examiner — Michael Wieczorek
(74) Attorney, Agent, or Firm — Antonelli, Terry, Stout & Kraus, LLP.

(57) ABSTRACT

The pattern defect repairing apparatus comprises an application head, a waste ejection board, a waste ejection vessel, a waste ejection board moving stage, a head lifting stage, and an application unit base. The application head comprises an ink-jet head and a head holder. An ink jet head has an ejection nozzle, and is attached to the head holder and able to be moved up and down by the head lifting stage. The waste ejection vessel is provided to the waste ejection board and able to be moved between a waste ejection position and a retreated position by the waste ejection board moving stage. Repairing material is ejected for waste onto the waste ejection board set in the vicinity of the nozzle immediately before application to repair the defect. The tip end of the nozzle is prevented from being dried.

4 Claims, 11 Drawing Sheets

METHOD FOR REPAIRING PATTERN DEFECT ON ELECTRONIC CIRCUIT AND APPARATUS THEREFOR

CROSS-REFERENCE TO RELATED APPLICATION

The present application claims priority from Japanese application JP2008-020248 filed on Jan. 31, 2008, the content of which is hereby incorporated by reference into this application.

BACKGROUND OF THE INVENTION

1. Field of the Invention

The present invention relates to a method for repairing a pattern defect caused on an electronic circuit board, the method being preferable for repairing a pattern defect caused on an electronic circuit formed on a thin film transistor substrate of a liquid crystal display device or an organic EL display device.

2. Description of the Related Art

With expansion of the liquid crystal display device market, demand for a lower price is growing and stricter. Meanwhile, a glass substrate for use in manufacturing of this kind of display device becomes larger every year, which makes it no longer possible to manufacture a liquid crystal display having an electronic circuit free from pattern defects only through process improvement. This is one of the major contributions of cost increase. In view of the above, a step of repairing such a pattern defect on an electronic circuit is indispensable in a manufacturing process. Here, note that a pattern defect on an electronic circuit includes not only a defect on a wiring or an electrode mounted on a thin film transistor substrate but also a defect on a general structural pattern, such as a semiconductor layer, an insulating layer, and so forth, of an electronic circuit. A defect on a black matrix layer and a color filter layer formed on a color filter substrate are also included.

A liquid crystal display device has a structure in which liquid crystal is sandwiched between a substrate (a thin film transistor substrate, a TFT substrate) where a thin film transistor (TFT) circuit is formed for each pixel and a color filter substrate (a CF substrate) where red, blue, green resin filters are arranged in a matrix. In this structure, if a pattern defect should be caused on a wiring, an electrode, or an insulating layer of a pixel circuit formed on the TFT substrate or a color filter on a color filter substrate, abnormal displaying is resulted, and the relevant liquid crystal display device is accordingly regarded defective. Abnormal displaying includes, e.g., color defect due to a resin film expanding to an adjacent pixel on a color filter, inconsistent application due to inconsistent thickness of a resin film, a pinhole, that is, a kind of inconsistent application of an orientation film for liquid crystal orientation, short circuit and/or disconnection of a wiring and/or an electrode forming a pixel circuit, and so forth.

As a technique for repairing such disconnection of an electronic circuit, Japanese Patent Laid-open Publication No. Sho 57-118246 discloses a method for repairing disconnection of a circuit by applying repairing material which will deposit low resistive metal through laser beam irradiation via, e.g., a micro syringe. Also, though not for pattern defect repairing, Japanese Patent Laid-open Publication No. 2004-45069 discloses a method, employed for an ink-jet application method, for addressing application instability due to dried application material (or ink) at a nozzle ejection hole. According to this method, a waste ejection position is provided outside a stage for transporting an application target, and application material is ejected for waste so that application is carried out after an application amount, or an ejection amount, to be ejected from a nozzle is stabilized.

In ink-jet defect repairing in a process of manufacturing, e.g., a TFT substrate of a liquid crystal panel, however, a problem may be caused with an application target TFT substrate larger than 2 m×2 m, despite provision of a waste ejection position outside an application target substrate, as described in the above mentioned Japanese Patent Laid-open Publication No. 2004-45069, such that the state, e.g., viscosity, of the repairing material (application material) at the tip end of the nozzle may be changed while the nozzle moves to a disconnected portion to be repaired, which hinders normal application of the application material. Further, quick-dry nature of repairing material to be applied may cause a problem such that the repairing material is dried while the nozzle moves from the waste ejection position to an application position, which also hinders normal stable application of the application material.

An object of the present invention is to provide a method for repairing a pattern defect caused on an electronic circuit board of a TFT substrate or a color filter substrate by applying liquid in a stable manner by preventing the tip end of a nozzle of an ink jet application apparatus from being dried while the nozzle moves from a waste ejection position to an application position due to quick-dry nature of liquid application material or the large size of an application target.

SUMMARY OF THE INVENTION

In order to attain the above described object, a movable repairing material waste ejection board is provided in the vicinity of the ejection head of an ink jet application apparatus, so that waste ejection of repairing material is carried out in the vicinity of a defect to be repaired. With the above, a period of time needed by the nozzle to move from the repairing material waste ejection position to the defect position is reduced so that the tip end of the nozzle of the ejection head can be prevented from being dried. As a result, application of repairing material can be performed with a stable ejection amount of the nozzle. Further, an observation unit having an image capturing device as a means for measuring an ejection amount is provided to the movable repairing material waste ejection board, and the shape and position of the liquid repairing material ejected for waste are measured and compared with a predetermined value. With the above, application of repairing material to a defect can be performed with stable repairing material ejection.

According to the present invention, it is possible to repair disconnection of a circuit pattern or the like formed on a large substrate and to prevent occurrence of a defect due to disconnection. This can advantageously reduce manufacturing cost. Further, as application of repairing material with quick-dry nature, which cannot conventionally be applied, is possible, a larger range of defects can be repaired. This contributes to improvement of manufacturing yield.

DETAILED DESCRIPTION OF THE INVENTION

In the following, best embodiments of the present invention will be described in detail, referring to the accompanying drawings of embodiments of the present invention. In the following, repairing of a wiring pattern of a liquid crystal display device is described as an example. The present invention, however, is not limited to such repairing, but is applicable to repairing of a defect on a pattern on a color filter substrate, and a defect on a circuit pattern of an electronic circuit board or the like which generally has various patterns formed on a flat surface thereof, a pinhole defect on a wholly formed film formed, and so forth. Further, the present invention is not limited to a liquid crystal display device.

[First Embodiment]

Figure 1:
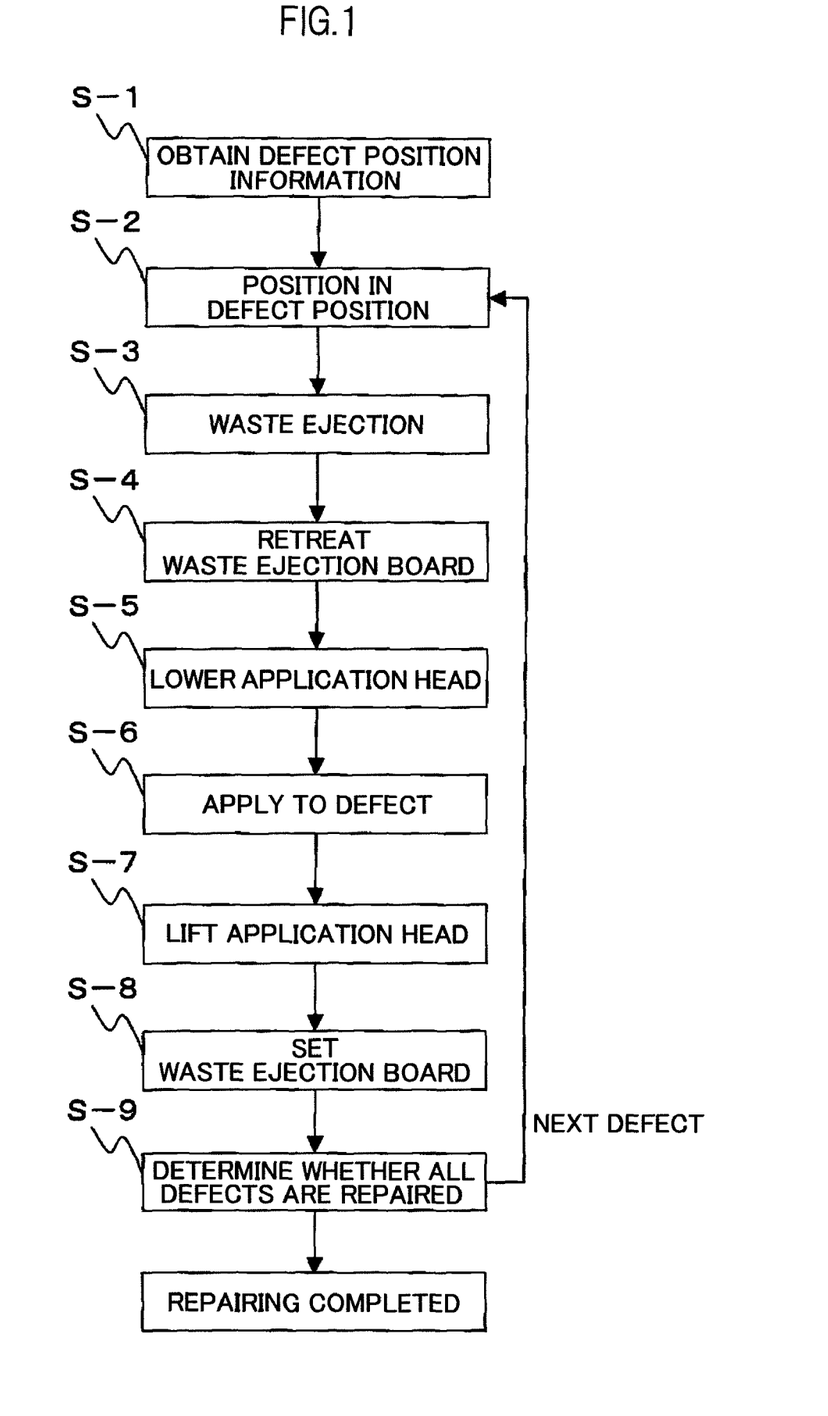
FIG. 1 is a diagram explaining an electronic circuit board manufacturing method according to a first embodiment of the present invention.
Figure 2:
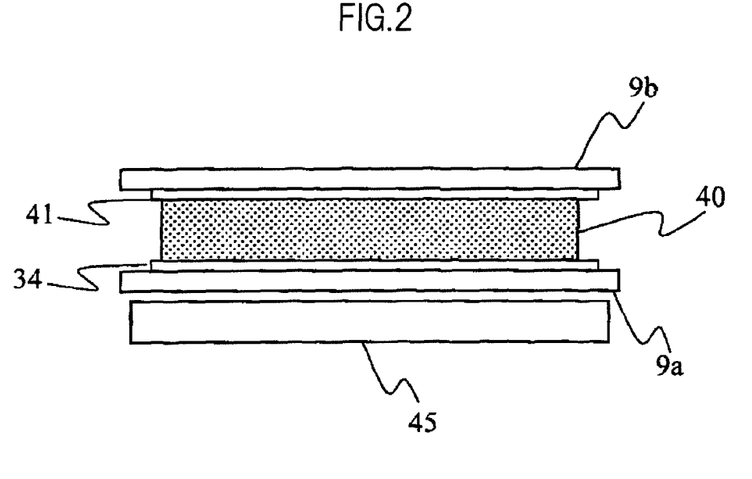
FIG. 2 is a cross sectional view of a typical liquid crystal display device.
Figure 3:
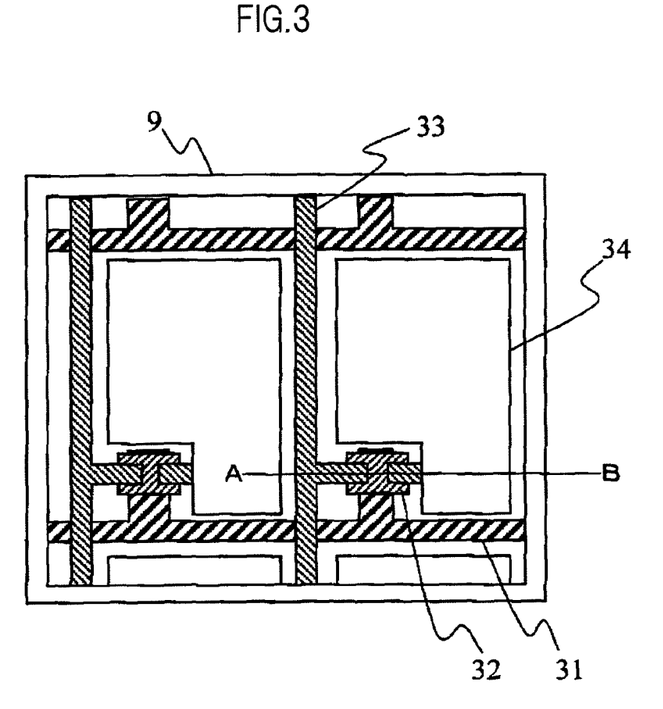
FIG. 3 is a plan view of a circuit board of the typical liquid crystal display device.
Figure 4:
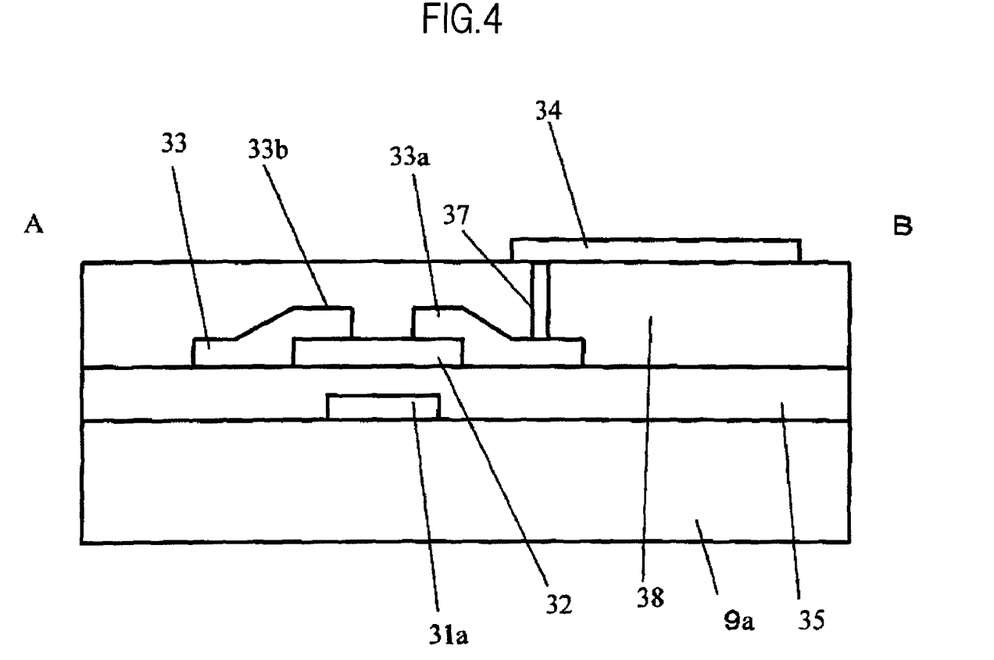
FIG. 4 is a cross sectional view of the circuit board of the typical liquid crystal display device.
Figure 5:
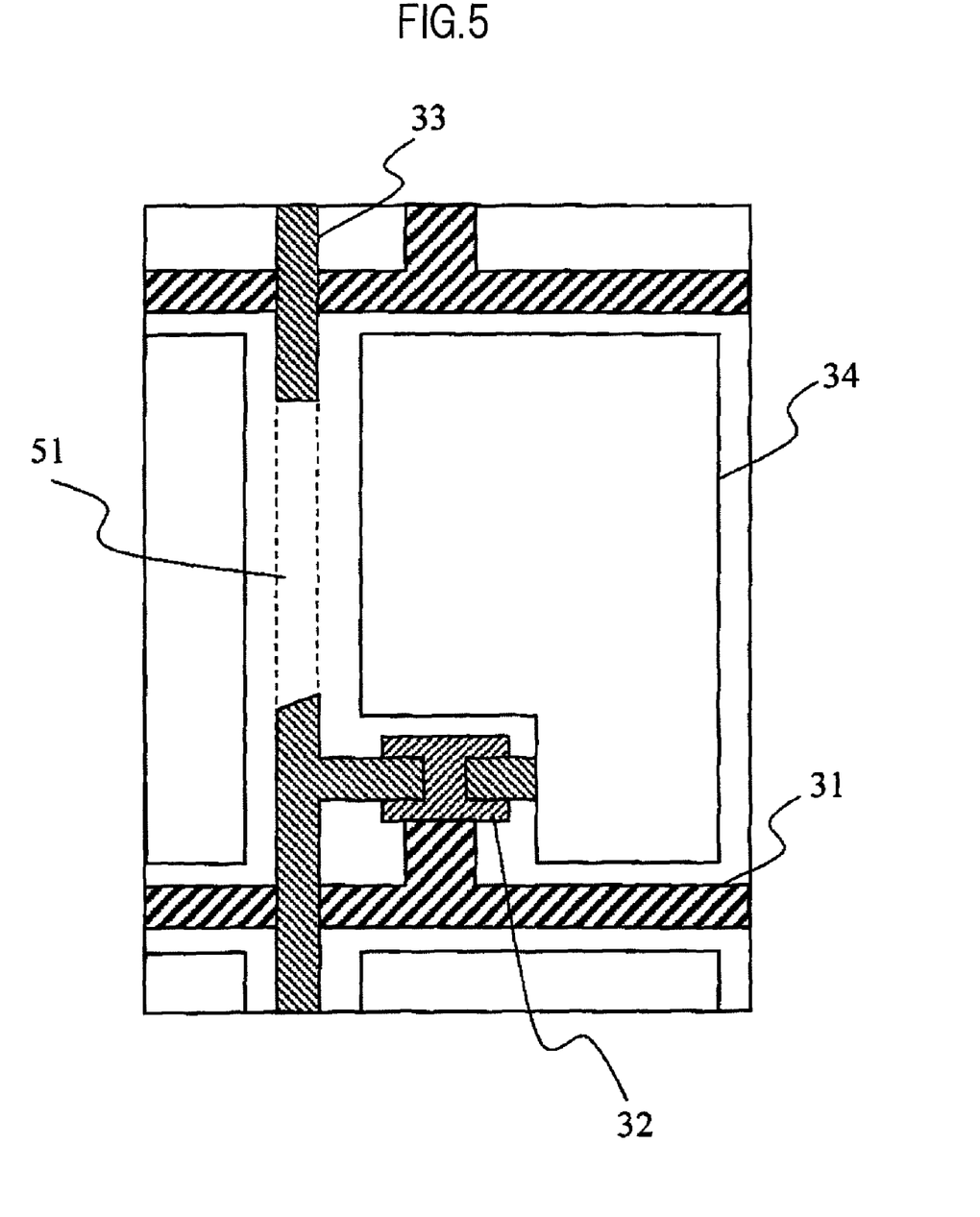
FIG. 5 is a diagram explaining a pattern defect.
Figure 6:
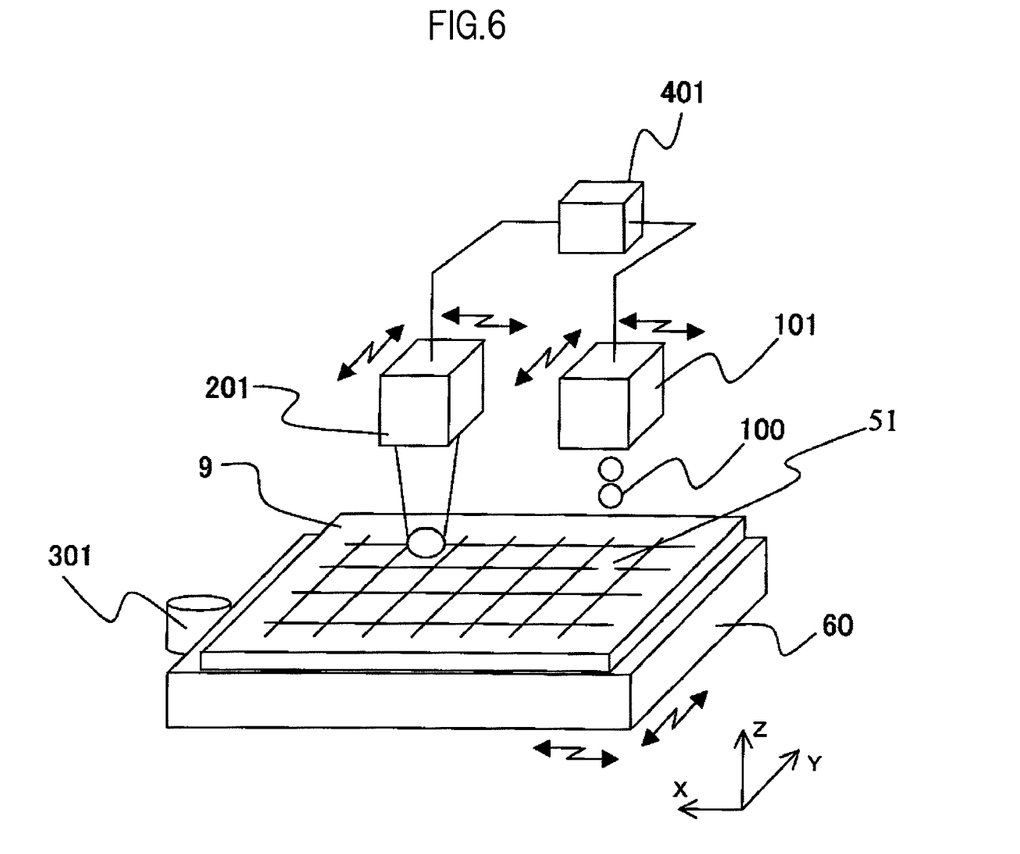
FIG. 6 is a diagram explaining a structure of an apparatus according to the first embodiment of the present invention.
Figure 7:
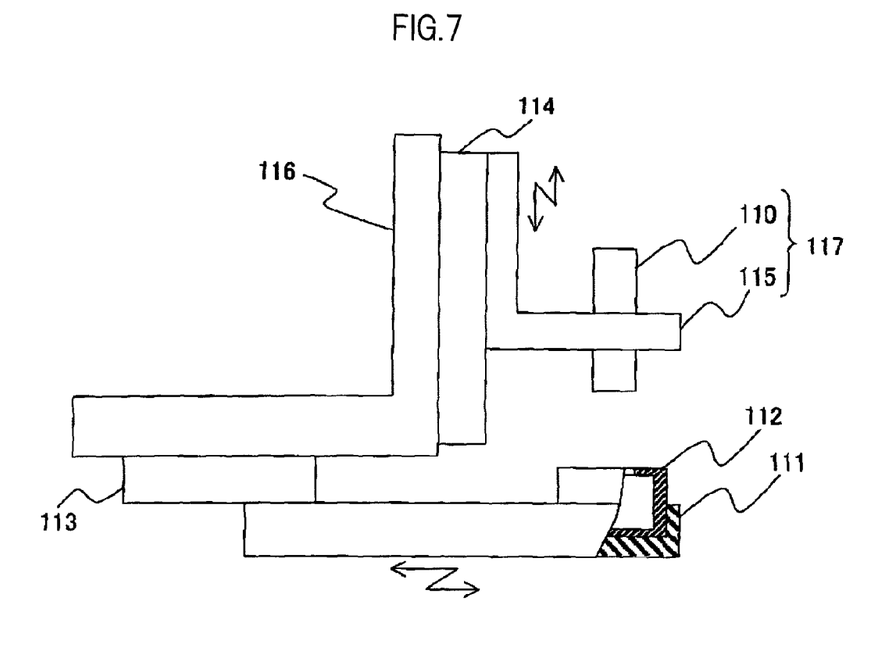
FIG. 7 is a diagram explaining a structure of an application unit.
Figure 8:
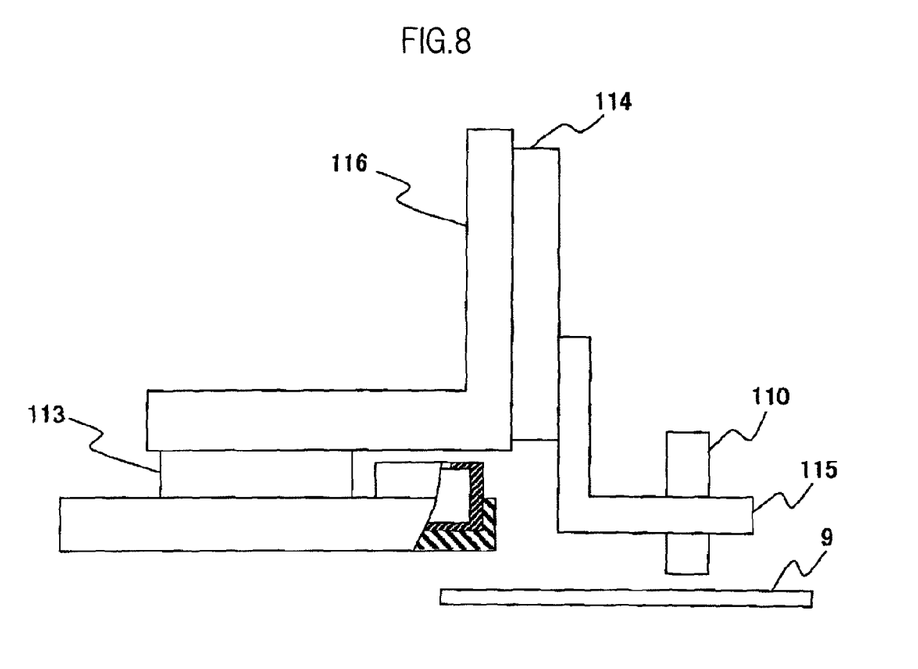
FIG. 8 is a diagram explaining an application operation of the application unit.

FIGS. 1 to 8 are diagrams explaining a first embodiment of the present invention. That is, FIG. 1 is a diagram explaining an electronic circuit board manufacturing method according to a first embodiment of the present invention. FIG. 2 is a cross sectional view of a typical liquid crystal display device. FIG. 3 is a plan view of a circuit board of the typical liquid crystal display device. FIG. 4 is a cross sectional view of the circuit board of the typical liquid crystal display device. FIG. 5 is a diagram explaining a pattern defect. FIG. 6 is a diagram explaining a structure of an apparatus according to the first embodiment of the present invention. FIG. 7 is a diagram explaining a structure of an application unit. FIG. 8 is a diagram explaining an application operation of the application unit.

Initially, referring to FIG. 2, the liquid crystal display device has a structure in which liquid crystal 40 is sandwiched between two glass substrates 9a, 9b, and the orientation of the liquid crystal molecules is controlled through an electric field caused inside a capacitor comprising a pixel electrode 34 and an opposed electrode 41 to thereby control the permeability of the light of a backlight 45. A circuit for controlling an application voltage of the pixel electrode 34 is formed on the substrate 9a. A color filter is provided on the substrate 9b to display a colored image.

The circuit of the liquid crystal display device is formed by laminating a plurality of patterns. FIG. 3 shows a typical circuit structure; FIG. 4 is a cross sectional view along the line A-B in FIG. 3. A multiple-layered thin film circuit formed on the glass substrate 9 comprises a gate electrode 31, a-Si layer 32, a source electrode 33, a pixel electrode 34, and an insulating film 35. The a-Si layer 32 constitutes a semiconductor switch, which is turned on in response to a voltage applied to the gate electrode 31. Thereupon, the voltage applied to the source electrode 33 is applied to the pixel electrode 34 to thereby drive the liquid crystal. With the voltage applied to the gate electrode 31 thereafter lowered, the semiconductor switch is turned off, upon which the voltage of the capacitor comprising the pixel electrode 34 and opposed electrode 41 is held. The insulating film 35 is formed between the gate electrode 31 and a-Si layer 32 and between the gate electrode 31 and source electrode 33 to prevent the wirings from being short-circuited.

The circuit of the liquid crystal display device is manufactured, generally using a photolithographic technique. Specifically, wiring material is initially applied to the entire surface of the glass substrate 9 to form a film thereon. Thereafter, resist is applied, and annealed. Then, a wiring pattern defined on a mask is projected onto the resist, using an aligner, thereby exposing the resist. An exposed portion of the resist is readily melted with developer liquid. Thus, when the glass substrate 9 is put in the developer, the exposed resist portion is removed, and an unexposed portion, constituting a wiring, remains not removed. When the glass substrate 9 is further put in an etching liquid, a portion of the film, other than the wiring portion with resist remaining thereon is removed. Finally, the residual resist is removed to thereby complete formation of a wiring.

The above described process is repeated more than twice to form an electronic circuit. In the above, there is a possibility that the circuit become defective due to, e.g., a defective wiring film formed over a glass substrate surface, a defective mask used in resist exposure, bubble introduced in the resist, inappropriate exposure, a defective resist pattern due to inappropriate development, a defective wiring film caused in etching due to an insufficiently attached resist, and so forth. A defect on a wiring film caused in wiring film formation or etching can be repaired by applying conductive paste and so forth. A defective resist can be amended by applying resist.

Referring to FIG. 5, showing an example of a defect on a wiring, presence of a pattern defect 51 prevents voltage from being applied to the source electrode 33, and therefore the circuit operates abnormal. To address the above, the source electrode 33 is formed again by applying repairing material, such as conductive past, to the defective portion, and annealing. FIG. 6 shows a structure of an application repairing apparatus. The application repairing apparatus comprises a substrate stage 60, an application unit 101, a curing unit 201, a waste ejection unit 301, and a controller 401. A glass substrate 9 to be repaired is sucked and placed on the substrate stage 60 such that the pattern defect 51 is located below the application unit 101. In the above, the substrate stage 60 and application unit 101 may move in the X and Y directions, respectively, such that the application unit 101 is positioned over the pattern defect 51. Alternatively, the application unit 101 may move in the X, Y directions so as to be positioned over the pattern defect 51.

The position of the pattern defect 51 can be determined, using a typical inspection apparatus. For example, images of a normal portion and a defective portion are compared using an optical inspection apparatus to specify a pattern defect 51 portion. Also, a disconnected source electrode 33 may be specified using an electric inspection apparatus, and the disconnected portion may be extracted in optical inspection. A method using an electronic beam is further available. A method using a CCD camera to make inspection based on the total number of pixels in a two dimensional plane is further usable. The controller 401 receives position information about the pattern defect 51 from the inspection apparatus, and then moves the pattern defect 51 to below the application unit 101.

Thereafter, the amount of repairing material 100, set in advance on the controller 401, is ejected from the application unit 101 onto the pattern defect 51. Note that the repairing material 100 for application is not limited to conductive paste, but non-conductive material, such as resist, color filter repairing material, orientation film repairing material, and so forth may be applicable. In particular, repairing material, e.g., resist, color filter repairing material, orientation film repairing material, and so forth, which cannot be conventionally used due to quick-dry nature thereof, is usable here. This makes it possible to repair a pattern defect which cannot be conventionally repaired, and thus contributes to improvement of yield. Thereafter, the pattern defect 51 is moved to below the curing unit 201, and the applied repairing material 100 is dried and cured.

In the case where the repairing material 100 is applied in an ink-jet manner, the viscosity of the repairing material 100 is changed as the solvent is dried, which in turn changes the amount of ejection. To address the above, generally, the repairing material 100 is ejected for waste, and once the ejection amount is stabilized, the repairing material 100 is applied to the pattern defect 51. In the above, however, as the waste ejection unit 301 is provided outside the substrate stage 60, a problem will be caused with an application target larger than 2 m×2 m horizontally and vertically, such as, e.g., a liquid crystal glass substrate, such that the state, e.g., viscosity, of the repairing material 100 stuck to the ink-jet head (an ejection nozzle) will be changed after waste ejection, which hinders predetermined application.

In view of the above, in the first embodiment, a waste ejection unit is provided in the vicinity of the ink-jet head. The waste ejection unit is moved to the pattern defect 51, and waste ejection is then performed. Thereafter, the waste ejection unit is retreated, or moved away from the ink-jet head, and the repairing material 100 is then applied to the pattern defect 51. By reducing the period of time from waste ejection to application as described above, the ink-jet head is prevented from being dried, which makes it possible to perform application for repairing with a stable ejection amount.

FIG. 7 shows a structure of the application unit 101 which comprises an application head 117, a waste ejection board 111, a waste ejection vessel 112, a waste ejection board moving stage 113, a head lifting stage 114, and an application unit base 116. The application head 117 comprises an ink-jet head 110 and a head holder 115. The ink-jet head 110 having an ejection nozzle is attached to the head holder 115 so as to be moved up and down by the head lifting stage 114. The waste ejection board 111 accepts the waste ejection vessel 112, and can be moved between a waste ejection position and a retreated position by the waste ejection board moving stage 113.

In the following, referring to FIG. 1, an operation for repairing a pattern defect on a circuit will be described. Initially, defect position information is obtained, using the inspection apparatus (S-1). Then, the application unit 101 is positioned over the defect position of the pattern defect 51 (S-2). Then, after waste ejection is performed (S-3), the waste ejection board is retreated (S-4). Thereafter, the application head is lowered (S-5), and repairing material is applied to the defect portion (S-6).

FIG. 8 shows one example the state of the application unit 101 when applying repairing material to a defect portion. After application of a predetermined amount of repairing material 100, the application head is lifted up (S-7), and the waste ejection board is set, or returned to a waste ejection position (S-8). If there is another pattern defect 51 on the same circuit substrate, the application unit 101 is moved to that defect, and the above described application operation is repeated. With determination of all defects being repaired (S-9), the operation for repairing is completed. Note that an image of the pattern defect 51 subjected to the repairing may be obtained after the waste ejection board is set to determine whether or not the pattern defect 51 has been appropriately repaired. Note that situating the waste ejection board 111 below the ink-jet head 110 during a period other than an application period is useful in preventing the repairing material 100 from dropping from the inkjet head 110 to the glass substrate 9. Note that although ink-jet application is described here as an example, application in other manners using, e.g., a so-called dispenser, a pin, micropipette, and so forth may be also applicable.

In this embodiment, as the state of application of the repairing material 100 can be stabilized, it is possible to improve application accuracy, and also to repair disconnection or the like of a pattern of an electronic circuit formed on a large substrate. This can avoid production of a defective product, and contribute to reduction of manufacturing cost. Also, as use of quick-dry repairing material, which cannot be conventionally used, is possible, a wider range of objects can be repaired.

[Second Embodiment]

Figure 9:
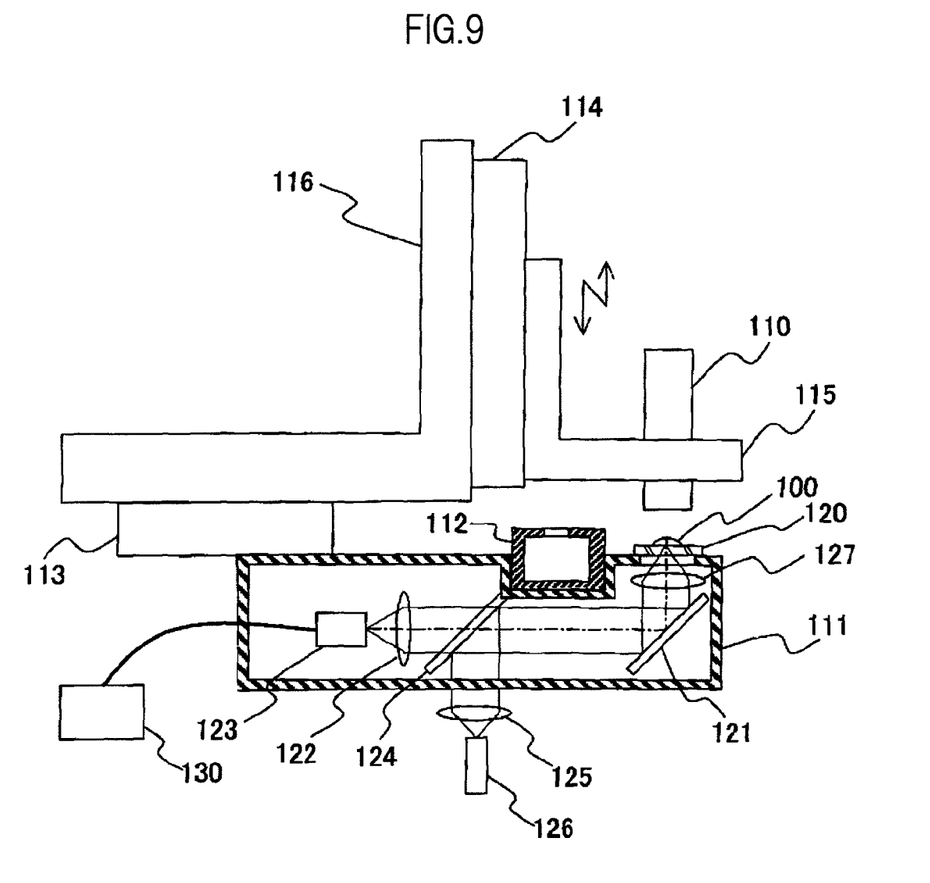
FIG. 9 is a diagram explaining one example of a structure of an apparatus according to a second embodiment of the present invention.
Figure 10:
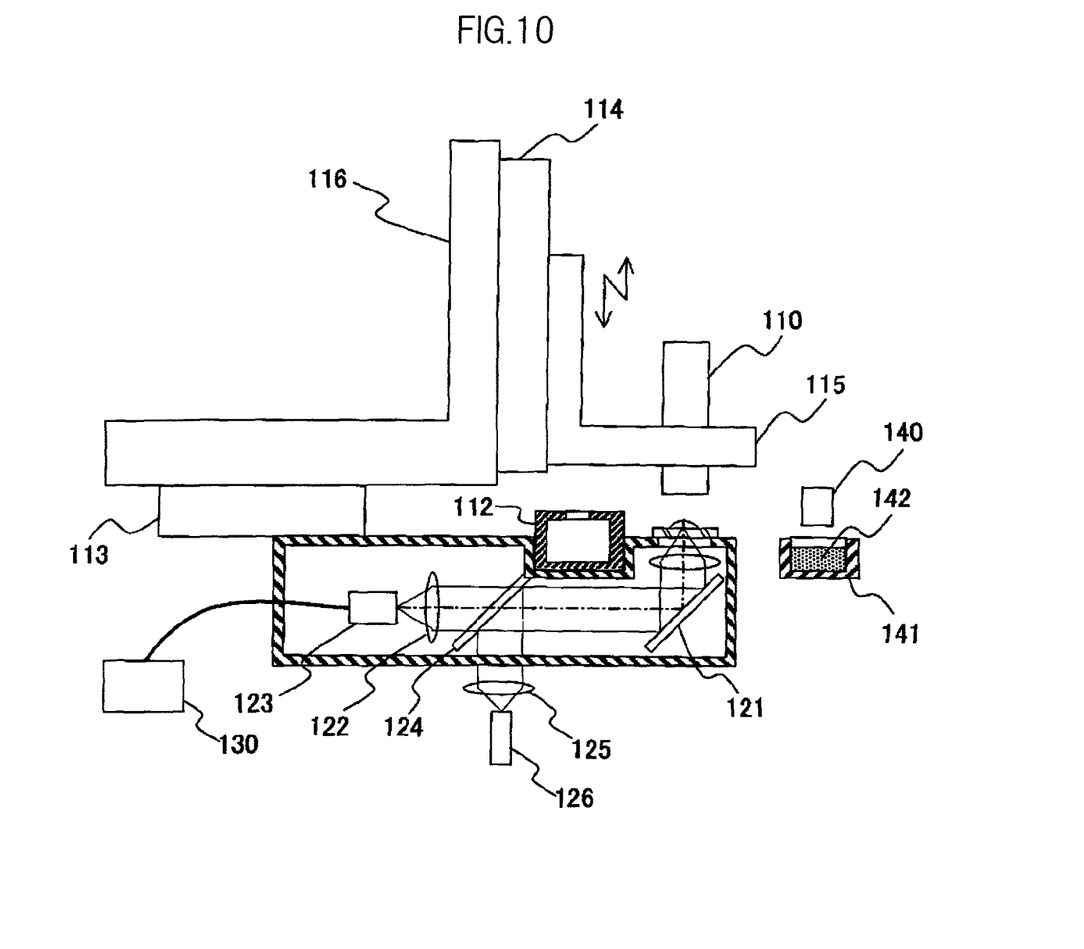
FIG. 10 is a diagram explaining another example of a structure of the apparatus of the second embodiment of the present invention.
Figure 11:
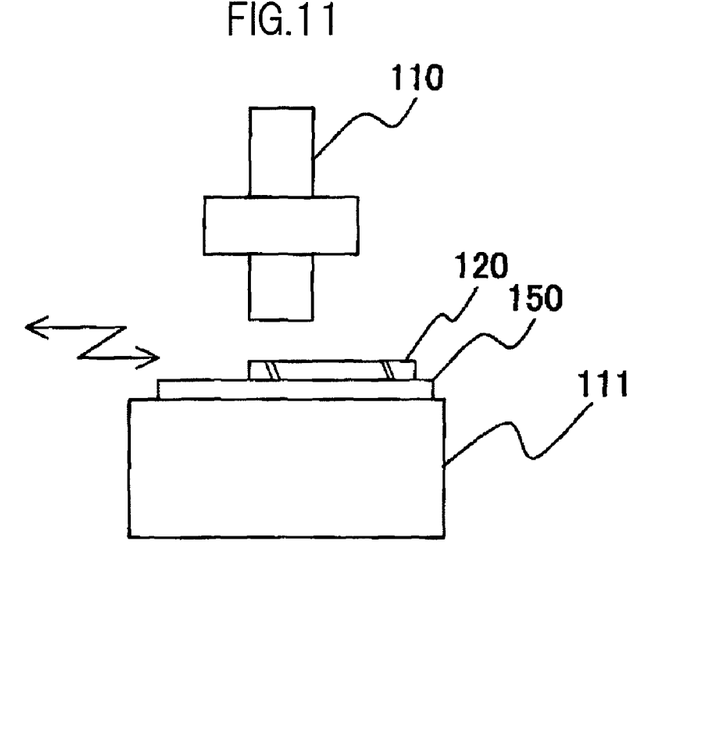
FIG. 11 is a diagram explaining one example of a structure of a major part of the second embodiment of the present invention.
Figure 12:
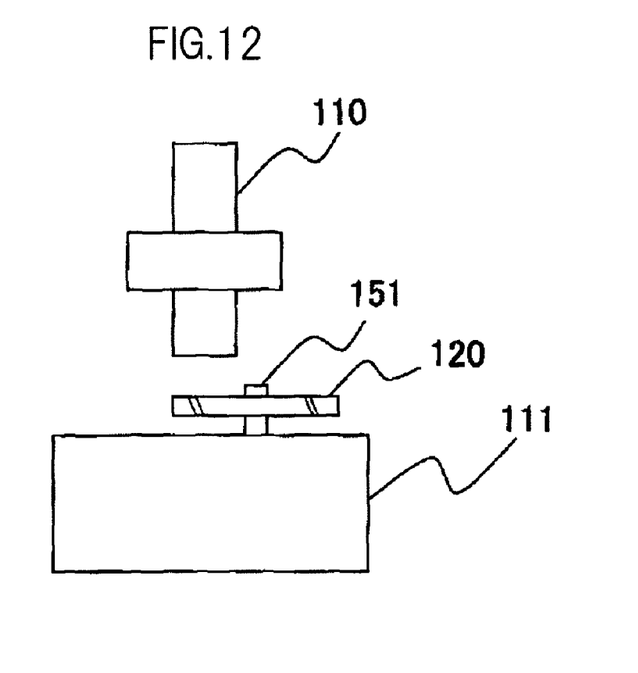
FIG. 12 is a diagram explaining another example of a structure of the major part of the second embodiment of the present invention.
Figure 13:
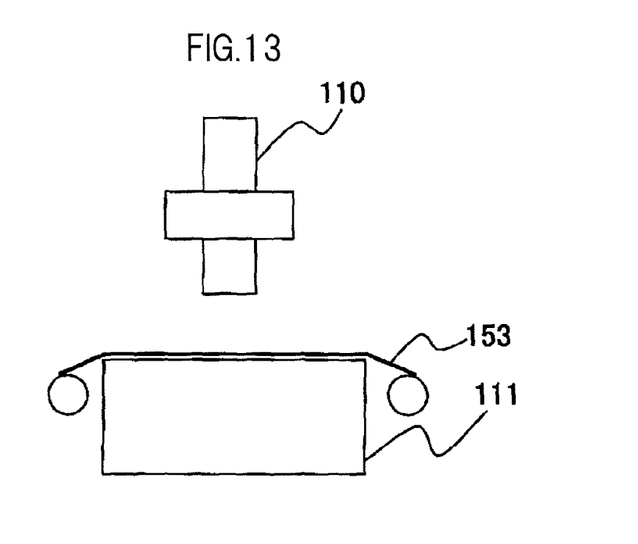
FIG. 13 is a diagram explaining still another example of a structure of the major part of the second embodiment of the present invention.
Figure 14:
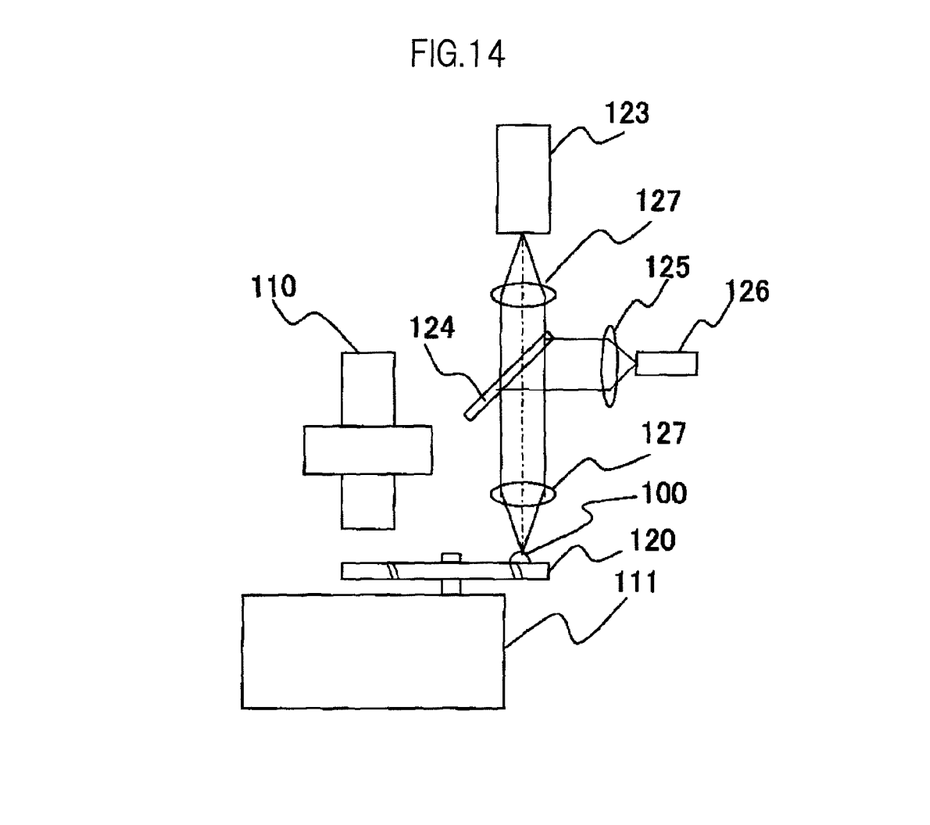
FIG. 14 is a diagram explaining yet another example of a structure of the major part of the second embodiment of the present invention.

FIGS. 9 to FIG. 14 are diagrams explaining a second embodiment of the present invention. FIG. 9 is a diagram explaining one example of a structure of an apparatus according to a second embodiment of the present invention. FIG. 10 is a diagram explaining another example of a structure of the apparatus of the second embodiment of the present invention. FIG. 11 is a diagram explaining one example of a structure of a major part of the second embodiment of the present invention. FIG. 12 is a diagram explaining another example of a structure of the major part of the second embodiment of the present invention. FIG. 13 is a diagram explaining still another example of a structure of the major part of the second embodiment of the present invention. FIG. 14 is a diagram explaining yet another example of a structure of the major part of the second embodiment of the present invention.

The second embodiment relates to a structure which additionally includes an observation system for observing the shape and position of the repairing material ejected for waste onto the waste ejection board 111. The observation system comprises a sample application board 120, serving as an observation window, an objective lens 127, a reflection mirror 121, an imaging lens 122, a CCD camera 123, a half mirror 124, a light source lens 125, a fiber illuminator 126, and an image processing unit 130. After waste ejection onto the waste ejection vessel 112, a predetermined amount of drops of repairing material 100 is applied onto the sample application board 120, which is made of transparent material, such as glass, so that the applied repairing material 100 on one side thereof can be observed from the other side, or rear side, thereof.

One end of the fiber illuminator 126 is connected to a light source (not shown) and the other end thereof is placed opposed to the light source lens 125. Light from the fiber illuminator 126 is modified via the light source lens 125 into substantial parallel light, and then reflected on the half mirror 124 and then another reflection mirror 121 before illuminating the repairing material 100 applied in an inkjet manner and deposited on the sample application board 120, or the observation window. Then, the image of the applied drops of repairing material 100 is formed via the objective lens 127 and imaging lens 122 on the image capturing element 123 whereby an image of the repairing material 100 is obtained. The obtained image of the repairing material 100 is sent to the image processing unit 130. The image processing unit 130 extracts information about the shape and position of the repairing material 100 drops, and compares with a predetermined threshold. For the information not satisfying a predetermined condition, an alert may be put out.

In order to repeat check on the state of application, it is necessary to wipe out the applied drops of repairing material 100 after an image is obtained. FIG. 10 shows an example of a structure which includes a wiping mechanism. The wiping mechanism comprises a wiping member 140, a cleaning vessel 141, and cleaning liquid 142. The wiping member 140 may be cloth or sponge which can soak the cleaning liquid 142. The wiping member 140 with the cleaning liquid 142 soaked therein is held inside the cleaning vessel 141.

With the image of the repairing material 100 having been obtained as described with reference to FIG. 9, the wiping member 140 is taken out from the cleaning vessel 141 and the repairing material 100 is wiped out. Thereafter, the wiping member 140 is returned to inside the cleaning vessel 141. The wiping member may be cleaned with supersonic or bubble caused inside the cleaning vessel 141. A mechanism for sliding the observation window 120 placed on the stage 150, as shown in FIG. 11, a mechanism for rotating the observation window 120 around a rotational axis 151, as shown in FIG. 12, or a mechanism, with a winding transparent film 153 used, for winding up the winding transparent film 153 after application, as shown in FIG. 13 may be employed. In FIG. 14, a sliding observation window 120 or a rotating observation window 120 is used, and the repairing material 100 deposited on the sample application board 120 is viewed from the side of the observation window 120, where the repairing material 100 is deposited.

Figure 15:
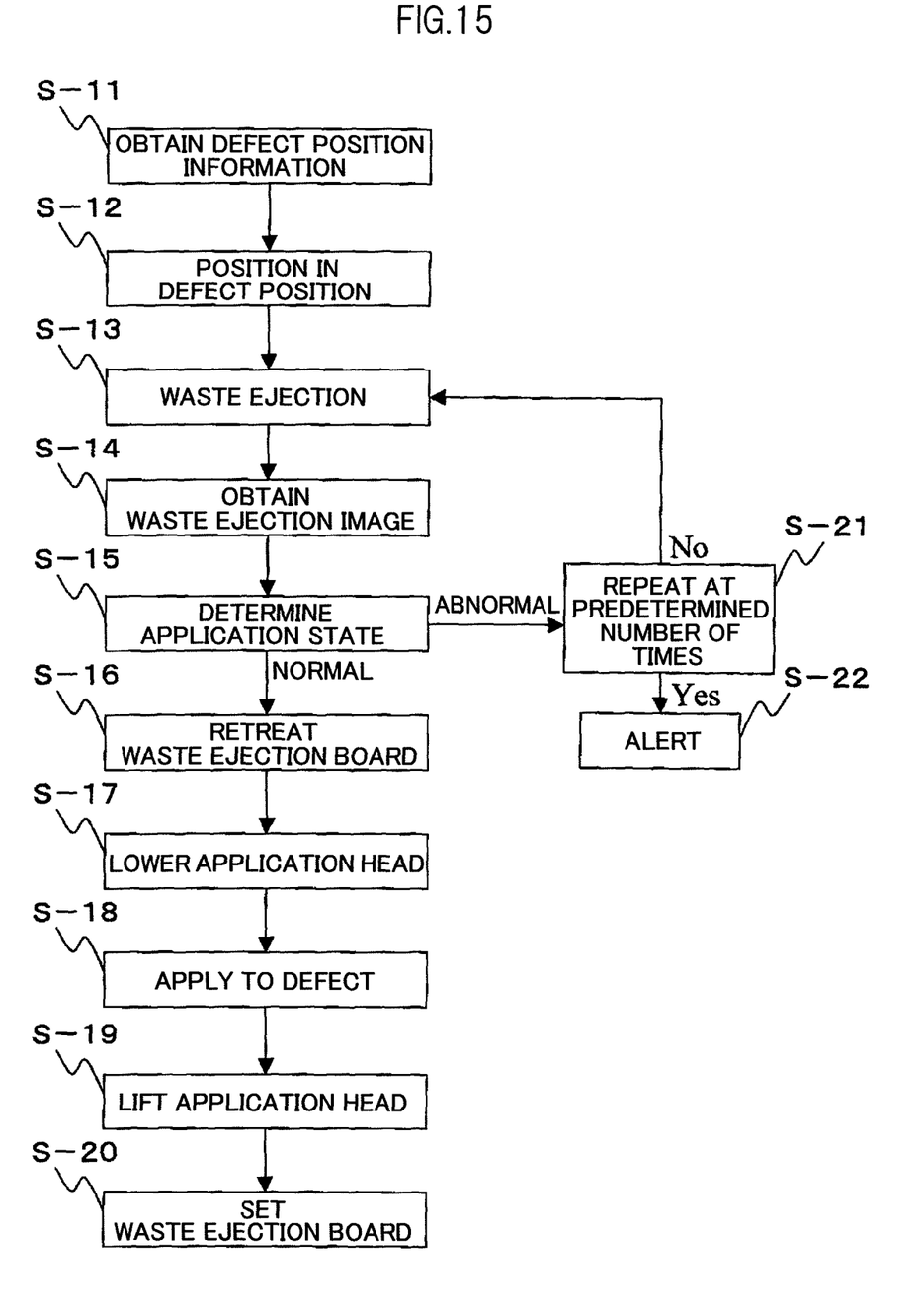
FIG. 15 is a diagram explaining an electronic circuit board manufacturing method according to the second embodiment of the present invention.

FIG. 15 is a diagram explaining a method for manufacturing an electronic circuit board according to the second embodiment of the present invention. In the following, referring to FIG. 15, a repairing operation to be carried out, using an apparatus which additionally includes an observation system will be described. Initially, similar to the first embodiment, defect position information is obtained, using the inspection apparatus (S-11). Then, the application unit 101 is moved to be positioned over the defect position of the pattern defect 51 (S-12). Then, waste ejection is performed (S-13), and an image of the repairing material ejected for waste is obtained (S-14). Thereafter, information about the shape and position of the applied repairing material 100 is obtained, based on the obtained image, to determine the state of the application (S-15). The information is compared with a predetermined threshold. When the information does not satisfy a predetermined condition, waste ejection (S-13) is carried out again. When the state of application determination remains abnormal even after repetition of waste ejection at a predetermined number of times, an alert is put out (S-22).

When the state of application is determined normal (S-15), the waste ejection board is retreated (S-16) before lowering the application head (S-17), and repairing material is applied to the defect portion (S-18). Then, the application head is lifted up (S-19), and the waste ejection board is then set (S-20). If there is another pattern defect 51 on the same circuit substrate, the application unit 101 is moved to that defect, and the above described application operation is repeated. Note that an image of the pattern defect 51 subjected to repairing may be obtained after setting the waste ejection board (S-20) to determine whether or not the repairing material has been appropriately applied.

According to the second embodiment, as the state of application can be evaluated after waste ejection, application accuracy can be improved, and application failure can be prevented. This can avoid production of a defective product, and thus can reduce manufacturing cost.

The present invention relates to a technique for repairing an electronic circuit board and is applicable to manufacturing of a liquid crystal display device, a plasma display, an organic EL display (Electro Luminescence), an FED (Field Emission Display), and so forth.

What is claimed is:

1. A method for repairing a pattern defect caused on at least one of an electronic circuit substrate composed of an electronic circuit formed on the electronic circuit substrate and a color filter substrate composed of a color filter formed on the color filter substrate, the method comprising the steps of:

providing a repairing material application unit having a repairing material application head for repairing the pattern defect, a waste ejection board for receiving waste of for the repairing material, the waste ejection board being movable to different positions with respect to the repairing material application head, a sample application board, and an applied sample observing unit for determining shape and position of the repairing material applied onto the sample application board;

defect detection for detecting the pattern defect caused on the at least one of the electronic circuit formed on the electronic circuit substrate and the color filter formed on the color filter substrate and providing information about a position of the pattern defect detected on the at least one of the electronic circuit substrate and the color filter substrate;

positioning the repairing material application unit having the waste ejection board for receiving the waste of the repairing material to a waste receiving position with respect to the position of the pattern defect using the position information about the position of the pattern defect detected in the defect detection step on the at least one of the electronic circuit substrate and the color filter substrate;

ejecting waste of the repairing material for waste from the repairing material application head onto the waste ejection board which is positioned at the waste receiving position with respect to the repairing material application head and moving the waste ejection board away from the waste receiving position;

after the waste ejection step, moving the sample application head to a position below the repair material application head and applying the repairing material as a sample from the repairing material application head onto the sample application board;

application state determination for determining the shape and position of the repairing material applied onto the sample application board, using the applied sample observing unit, and comparing with a predetermined value to determine whether or not to permit application of the repairing material;

when it is determined in the application state determination step that application of the repairing material is not permitted, repeating the waste ejection and sample application steps at a predetermined number of times;

when it is determined in the application state determination step that application of the repairing material is permitted, moving the sample application board away from the position below the repairing material application head, then lowering the repairing material application unit toward at least one of the electronic circuit substrate and the color filter substrate, and applying the repairing material onto the defect; and after applying the repairing material to the defect, lifting the repairing material application unit and returning the waste ejection board back to the position below the repairing material application head.

2. The method according to claim 1,
wherein a waste ejection vessel is attachable to the waste ejection board, and wherein the repairing material is ejected for waste into the waste ejection vessel which is attached to the waste election board in the waste ejection step.

3. The method according to claim 1, further comprising the step of:
removing the repairing material applied on the sample application board.

4. The method according to claim 1, further comprising the step of:
putting out an alarm when the waste ejection and the sample applying steps have been carried out at the predetermined number of times without the application of the repairing material to the defect being permitted.

* * * * *